United States Patent [19]

Thomas et al.

[11] 4,146,846

[45] Mar. 27, 1979

[54] AMPLIFIER HAVING A HIGH FREQUENCY BOOST NETWORK

[75] Inventors: Wayne D. Thomas, Tigard; Richard L. Compton, Beaverton, both of Oreg.

[73] Assignee: Tektronix, Inc., Beaverton, Oreg.

[21] Appl. No.: 905,916

[22] Filed: May 15, 1978

[51] Int. Cl.[2] .............................................. H03F 1/34
[52] U.S. Cl. ..................... 330/293; 307/270; 307/294; 328/114; 328/132; 330/126; 330/294; 330/306
[58] Field of Search .................. 330/3, 126, 302, 306, 330/293, 294, 297; 307/270, 294; 328/114, 132

[56] References Cited

U.S. PATENT DOCUMENTS 3,922,585  11/1975  Andrews ........................... 330/293 X Primary Examiner—James B. Mullins
Attorney, Agent, or Firm—George T. Noe

[57] ABSTRACT

An amplifier includes a network which generates additional output current for driving a substantially capacitive load as the frequency of an input signal is increased. The network comprises a plurality of rate discriminators which activate additional current sources at predetermined frequencies.

4 Claims, 1 Drawing Figure

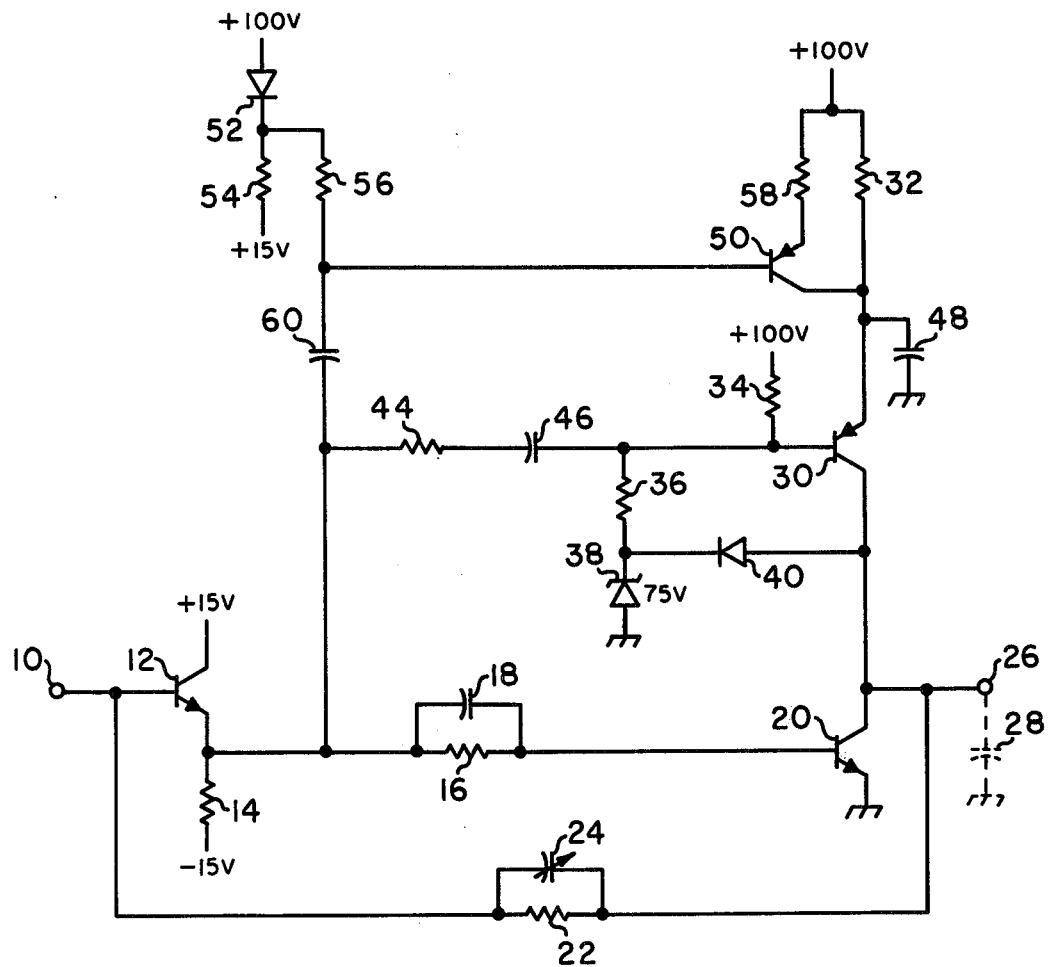

AMPLIFIER HAVING A HIGH FREQUENCY BOOST NETWORK

BACKGROUND OF THE INVENTION

The present invention relates generally to electronic amplifying circuits and more particularly to an amplifier having a high frequency boost network.

There are many situations in which it is desired to amplify signals which are primarily low in frequency but which have occasional high frequency components or level transitions. Examples of such amplifiers include those utilized in processing digital data, amplifiers utilized in conjunction with function generators, and Z-axis amplifiers or oscilloscopes. In such applications, high performance wideband amplifiers are presently utilized; however, the high performance amplifiers are costly, require large amounts of standing current and consequently have a high power consumption, and further require temperature compensation and overdrive protection circuitry.

SUMMARY OF THE INVENTION

In accordance with the present invention, an amplifier having a high frequency boost network is provided to increase the output current to drive a substantially capacitive load as the frequency of an input signal is increased.

The amplifier, which is intended to be operated at low frequencies, comprises a conventional shunt feedback amplifier. The high frequency boost network comprises a plurality of rate discriminators which activate additional current sources at predetermined frequencies. The additional output current provided is proportional to the signal amplitude passed by the rate discriminators.

It is therefore one object of the present invention to provide an improved wideband amplifier for driving a capacitive load.

It is another object to provide a wideband amplifier having a high frequency boost network to generate additional output current for driving a capacitive load as the frequency of an input signal is increased.

It is a further object to provide a wideband amplifier of inexpensive construction and which consumes very little power at low frequencies.

Further objects, features, and advantages will be apparent from consideration of the following description taken in conjunction with the accompanying drawing.

DRAWING

The single FIGURE is a schematic diagram of a preferred embodiment of the amplifier circuit of the present invention.

DETAILED DESCRIPTION OF THE PREFERRED EMBODIMENT

The preferred embodiment may be employed as the unblanking amplifier in the Z-axis circuit of a cathode ray oscilloscope for driving the control grid of the cathode-ray tube, thereby controlling the beam intensity thereof.

The lower portion of the amplifier shown is a conventional shunt feedback amplifier. Input signals are applied via an input terminal 10 to the base of transistor 12, which is connected as an emitter follower stage. The input signals are developed across emitter resistor 14 and coupled via resistor 16 and capacitor 18 to the base of transistor 20 connected as a common emitter amplifier with its emitter grounded. A shunt feedback path including a resistor 22 shunted by a variable capacitor 24 is connected from the collector of transistor 20 back to the base of transistor 12. The collector of transistor 20 is also connected to an output terminal 26, to which a capacitive load 28 is connected. The load capacitance 28 is shown by dashed lines because it is formed by the stray capacitance between the control grid and cathode, and between interconnecting wiring and other metal parts, rather than being a physical capacitor.

A current source is connected to the collector of transistor 20 to provide charging current for the capacitive load 28 as well as providing current to transistor 20 and the feedback path through resistor 22 and capacitor 24. The current source comprises transistor 30, current-setting resistor 32 connected to the emitter of transistor 30, and bias-setting voltage divider resistors 34 and 36. Resistor 36 is connected to ground through a Zener diode 38. A semiconductor diode 40 is connected between the cathode of Zener diode 38 and the collector of transistor 30 to provide protection for the cathode-ray tube by limiting the positive voltage which is applied to the grid. In this embodiment, Zener diode has a voltage rating of 75 volts, so on large positive-going overdrive signals, diode 40 turns on when the collector of transistor 20 tries to rise above +75 volts and clamps the voltage at this level until the overdrive condition is removed.

Typical operation of the circuit as thus far described is as follows: At DC and low frequencies, the current source transistor 30 provides a constant current. Assume that a positive voltage level sufficient to drive transistor 20 into saturation has been applied to input terminal 10 and that the circuit has stabilized at a steady state whereby all of the current provided by transistor 30 flows to ground through transistor 20. In this operating state, the capacitive load is completely discharged and thus the collector of transistor 20 is substantially at ground potential. Incidentally, this condition would cause the cathode ray tube to be cut off, or "blanked."

Now assume that a negative-going signal voltage of fairly low frequency is applied to the input terminal 10, and hence, via emitter follower 12 to the base of transistor 20. As the conduction of transistor 20 is reduced, current from transistor 30 is diverted from transistor 20 to the capacitive load 28 and the feedback capacitor 24, and the load and feedback capacitances begin to charge, developing a voltage across the load which is an inverted and amplified version of the input signal. From this description, it can be discerned that a positive-going input signal will increase the conduction of transistor 20, pulling current from the load capacitance 28 and feedback capacitance 24, thereby providing a discharge path therefor.

On intermediate-frequency input signals, for example, those intended to provide abrupt variation in the intensity of the cathode-ray tube electron beam, the current provided by current source 30 is increased momentarily to provide additional charging current to the load capacitance 28, thereby providing a slight boost in the frequency response. The input signal is applied from the emitter of the emitter follower transistor 12 to the base of transistor 30 via resistor 44 and capacitor 46. The additional current for transistor 30 is furnished by capacitor 48, which is connected between the emitter of transistor 30 and ground.

On high-frequency input signals, for example, the leading edge of large positive-going voltage transistions intended to drive the cathode ray tube from a cut off condition to normal beam intensity, an additional quantity of output current is required to cause the load capacitance 28 to quickly charge to the new level. This high frequency boost is provided by an additional current source transistor 50, which is normally turned off by the bias network comprising diode 52 and resistors 54, 56, and 58. To turn transistor 50 on, a negative-going signal is coupled from the emitter of transistor 12 via a capacitor 60 to the base of transistor 50. When transistor 50 turns on, additional current is provided through transistor 30 to the load capacitance 28, causing the load to charge quickly to the new positive voltage level.

Capacitors 46 and 60 and their associated resistive networks are essentially differentiating networks operated as rate discriminators. Accordingly, the values may be chosen to provide appropriate frequency ranges to which they will respond.

It will, therefore, be appreciated that the aforementioned and other desirable objects have been achieved; however, it should be noted that the particular embodiment of the invention, which is shown and described herein, is intended as merely illustrative and not as restrictive of the invention. For example, an additional current source and rate discriminator network similar to transistor 50 and capacitor 60 could easily be added to the circuit to provide a progressive high frequency boost over a wide range of frequencies.

What we claim as being novel is:

1. An amplifier circuit for driving a capacitive load, said amplifier including an input stage and an output stage, a current source coupled to said output stage and to said capacitive load, and a shunt feedback path coupled from said output stage to said input stage, wherein the improvement comprises:

high frequency boost means for increasing the current from said current source to said load at a plurality of predetermined lower cutoff frequencies.

2. An amplifier in accordance with claim 1 wherein said high frequency boost means includes at least a first and a second rate discriminator coupled between said input stage and said current source, said rate discriminators having predetermined first and second lower cutoff frequencies.

3. An amplifier in accordance with claim 2 wherein said rate discriminators comprise RC networks.

4. An amplifier in accordance with claim 3 wherein said high frequency boost means includes at least one active device for providing said current increase, said active device being responsive to one of said first and second rate discriminators.

* * * * *